United States Patent [19]

Berkman et al.

[11] 4,157,373

[45] Jun. 5, 1979

[54] APPARATUS FOR THE PRODUCTION OF RIBBON SHAPED CRYSTALS

[75] Inventors: Samuel Berkman, Florham Park; Kyong-Min Kim, E. Windsor; Harold E. Temple, Trenton, all of N.J.

[73] Assignee: RCA Corporation, New York, N.Y.

[21] Appl. No.: 844,139

[22] Filed: Oct. 20, 1977

Related U.S. Application Data

[63] Continuation of Ser. No. 680,072, Apr. 26, 1972, abandoned.

[51] Int. Cl.² .............................................. B01J 17/18
[52] U.S. Cl. .................................. 422/246; 422/249; 156/608; 156/617 SP; 432/194
[58] Field of Search .......... 156/608, 617 SP, DIG. 96, 156/DIG. 88; 23/273 SP; 432/193, 194, 203; 422/246, 248, 249

[56] References Cited

U.S. PATENT DOCUMENTS

| 2,893,847 | 7/1959 | Schweickert | 156/608 |
| 2,927,008 | 3/1960 | Schockley | 156/608 |
| 3,124,489 | 3/1964 | Vogel | 156/608 |
| 3,156,533 | 11/1964 | Infer | 156/608 |
| 3,249,404 | 5/1966 | Bennett | 156/608 |
| 3,393,054 | 7/1968 | Rupprecht | 156/608 |
| 3,954,551 | 5/1976 | Cecil | 156/608 |

FOREIGN PATENT DOCUMENTS

| 1210415 | 1966 | Fed. Rep. of Germany | 156/DIG. 96 |
| 41-13241 | 1966 | Japan | 156/608 |

Primary Examiner—Stephen J. Emery
Attorney, Agent, or Firm—Birgit E. Morris; A. Stephen Zavell

[57] ABSTRACT

Apparatus for pulling a ribbon shaped crystal from a melt of the same downwardly through a shaping guide having a "V" shaped longitudinal trough for containing the melt. The inner wall of the trough is a die set having a longitudinal slit at the apex of the "V".

4 Claims, 2 Drawing Figures

APPARATUS FOR THE PRODUCTION OF RIBBON SHAPED CRYSTALS

This is a continuation, of application Ser. No. 680,072, filed Apr. 26, 1976, now abandoned.

BACKGROUND OF THE INVENTION

The production of low cost semiconductor ribbon, such as silicon ribbon, for solar cells will permit the wide scale use of such solar cells for the generation of electric power. One method of producing such materials is known as the edge-defined film-fed growth (EFG) technique and is described by Swartz et al in Journal of Electronic Materials, Vol. 4, pp. 255–279 (1975). According to this technique, a crystal is pulled upwardly from a wetted die and a capillary rise through the center of the die feeds the material to the die edge. Patents such as U.S. Pat. No. 3,591,348 to LaBelle also describe the EFG process. A reaction between molten silicon and the die is one source of degradation of the crystallographic quality of the silicon produced thereby.

Stepanov in Soviet Physics-Technical Physics, Vol. 29, pp. 339–348 (1959) describes a process wherein sheets, plates, rods and various sections of metals and alloys are produced by pulling material upwardly through a non-wetting die floating on a pool of molten metal. In the Stepanov process, because of the non-wetting of the die, there is a lack of capillary action and a certain amount of hydrodynamic drag.

Rupprecht et al, U.S. Pat. No. 3,393,054, describe an apparatus for pulling a crystal with axially oriented semiconductor crystallites from a melt. The apparatus comprises a crucible containing a melt and having a lower opening having a particular two-part nozzle made of different materials so as to provide a large temperature gradient during freezing of the melt. A heating means is in operative proximity with the crucible. By means of this pulling nozzle one is able to pull a semiconductor rod, such as a bismuth telluride rod, downwardly from the melt.

Attempts to feed the rod from above, in growing a single crystal in a downwardly direction through a non-wetting die, constituting an inverted Stepanov technique, compensate partially for the hydrodynamic drag in the slot and for the lack of capillary rise in the Stepanov technique. Attempts to use the inverted Stepanov technique for producing silicon ribbon by placing an appropriate narrow slot in the bottom of a reservoir containing a liquid silicon melt has met with indifferent success.

The present invention provides an improved apparatus for the production of such crystals.

SUMMARY OF THE INVENTION

The invention provides an improved shaping guide for producing crystals by the inverted Stepanov technique. This shaping guide comprises a "V" shaped longitudinal trough for containing the melt. The inner surface of the trough is a die set having a longitudinal slit at the lower end of the "V" trough, through, which slit a ribbon may be pulled.

DETAILED DESCRIPTION OF THE INVENTION

The present invention provides an improved shaping guide for pulling a ribbon-shaped crystal from a melt by the inverted Stepanov technique.

Figure 1:
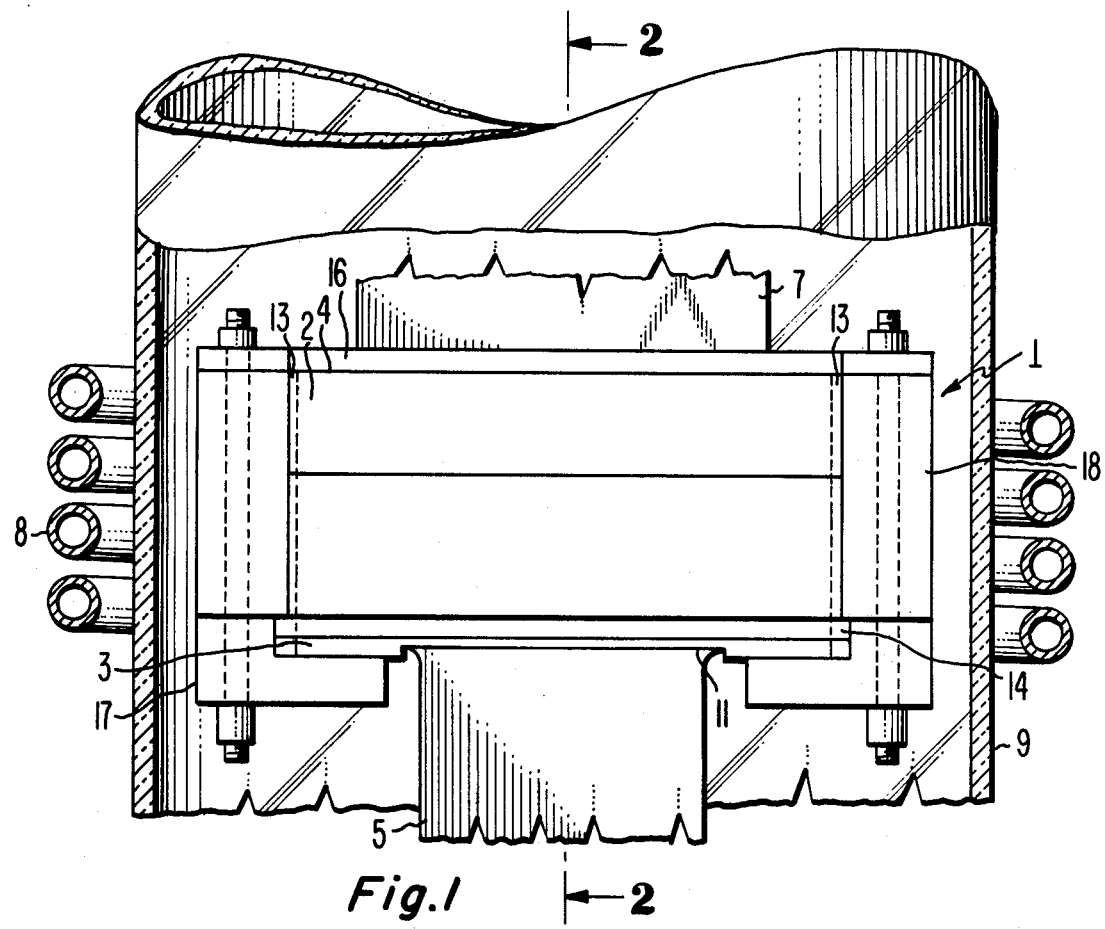
FIG. 1 shows a side view of a shaping guide according to the present invention.
Figure 2:
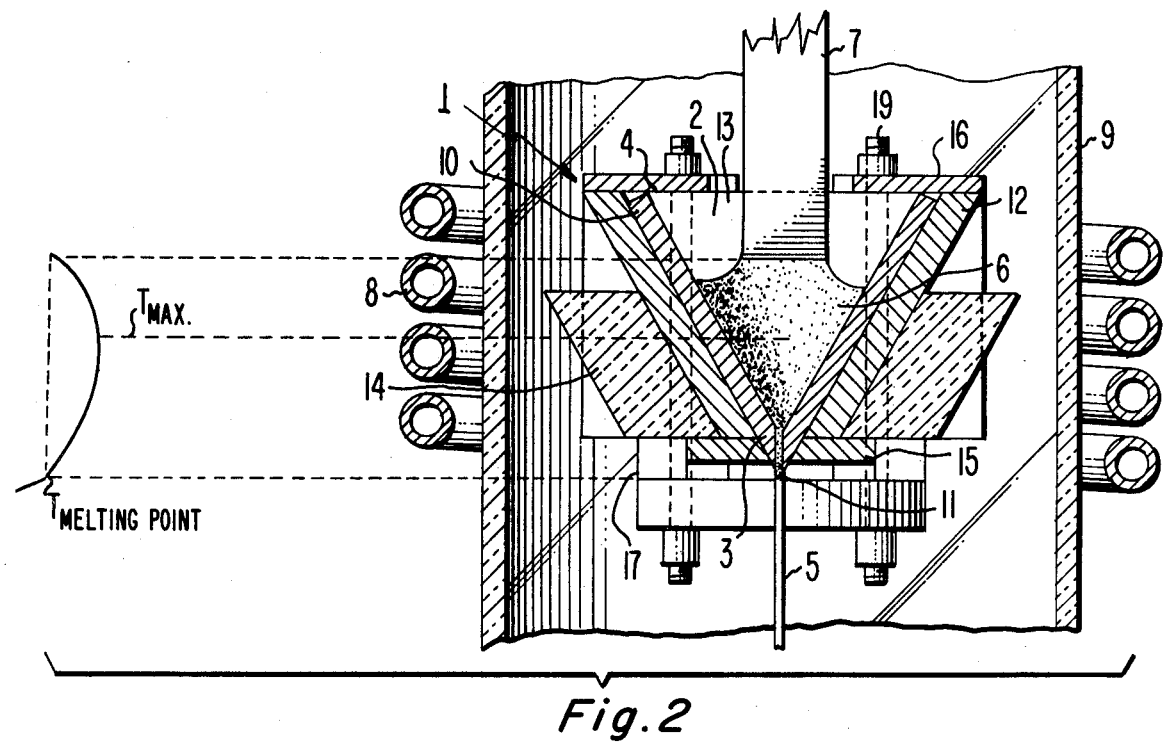
FIG. 2 shows a cross section along line 2—2 of FIG. 1 and the temperature gradient of silicon materials within the trough.

The shaping guide 1 will be described with respect to FIG. 1 and FIG. 2, which is taken along line 2—2 of FIG. 1. The shaping guide 1 comprises a "V" shaped longitudinal trough 2 having a lower apex 3, an upper base 4 and a length at least as great as the width of the ribbon 5 to be pulled downwardly through the shaping guide from a melt 6 of liquid silicon. The melt 6 is produced by heating a solid silicon bar 7, which may be monocrystalline or polycrystalline and may contain any of the conventional doping agents, by means of a suitable heating means, such as R.F. (radio frequency) coil 8 outside of the envelope 9 of quartz or other material in which the shaping guide 1 is provided. The configuration of the envelope 9 is not important and may be round, elliptical, rectangular, etc.

The inner wall 10 of the shaping guide 1 is a die set, having a longitudinal slit 11 at the apex 3, for pulling said ribbon 5 therethrough and is of any suitable material, such as quartz, boron nitride or carbon. Since all materials react to some extent with molten silicon, a suitable material is defined as one whose reaction products, in amount or type, do not interfere with the crystal growth. The die set 10 may be either a wetting or a non-wetting die. The die set 10, if of quartz, tends to soften at the melting temperature of silicon (1420° C.). The die set 10 is accordingly supported by susceptor 12, which is heated by the R.F. coil 8, in turn heats the solid silicon bar 7 to form the liquid silicon melt 6. The susceptor 12 is preferably made of graphite, since this material not only provides a support but also is readily heated by the R.F. coil 8. The susceptor 12 can also be of high temperature-resistant material such as molybdenum or tungsten.

The ends of the trough 2 are closed by plate 13, which is made of the same material as the die set 10. The bottom portion of the "V" shaped trough 2 is insulated by a commercially available graphite felt 14. Rigid insulation means 15 and 16, preferably of pyrolytic graphite, can be found at the apex 3 and upper base 4 respectively of the "V" shaped trough 2. The trough 2 is held in position by bracket 17 which in turn is clamped through end wall 18 to insulation 16 by a tungsten nut and bolt combination 19 for holding the entire "V" shaped trough together.

The entire device is substantially symmetrical and thus indicia have not been included for duplicative parts. The various parts of the shaping guide 1 can be machined before assembly for ease of construction.

In operation, a polycrystalline silicon bar 7 is melted by the R.F. coil 8 at a rate which corresponds essentially to the withdrawal rate of the grown silicon ribbon 5 so that the level of the melt 6 remains substantially constant. Alternatively, particles of material can be fed to the shaping trough 2 instead of the solid bar 7. A temperature gradient is produced in the melt as shown in FIG. 2. The temperature of the liquid silicon melt, just above the apex, is not far removed from that of the melting point of silicon per se. As a result of the steep temperature gradient, the silicon solidifies just about as it leaves the melt. By utilization of the shaping guide 1 of the present invention, we have been able to make silicon ribbons 1.5 centimeters wide and 0.05 centimeters thick at a rate of 10 linear centimeters per hour.

Although the growth of silicon has been described, crystals of other semiconductor metals and oxides, such as aluminum oxide, can be grown by the appropriate selection of compatible materials of construction.

Obviously heating means other than a R.F. coil may be used. However, the use of such a coil is preferred because, such use in conjunction with its varying distance to the susceptor and the "V" shaped trough, simplifies obtaining the temperature gradient. The silicon produced has a fairly smooth surface and has little or no contamination.

We claim:

1. In a crystal growing apparatus of the type adapted to pull a ribbon shaped crystal from a melt of the same downwardly through a shaping guide, an improved shaping guide which comprises:

a die set having a "V" shaped longitudinal trough for containing said melt, said trough having a lower apex and an upper base wherein the length of said trough is at least as great as the width of the ribbon to be pulled downward through said shaping guide and the inner wall of said trough has a longitudinal slit in said apex for pulling said ribbon shaped crystal, and a "V" shaped longitudinal susceptor which surrounds and supports said die set; and a radio frequency heating coil with a plurality of turns substantially surrounding said "V" shaped trough and susceptor, wherein the apex of said "V" shaped trough and susceptor are more remote from said heating coils than the edges of said upper base of said "V" shaped trough and susceptor, said coil in combination with said "V" shaped longitudinal susceptor being suitable for heating said melt in said trough such that the melt at the apex of said trough is at about the melting temperature of the material of the melt while the temperature of the melt between the apex and the melt surface is greater than the melting temperature, thereby providing a temperature gradient.

2. The apparatus of claim 1, wherein said susceptor is graphite.

3. The apparatus of claim 1, wherein said die is made of a material non-wetting with respect to the melt.

4. The apparatus of claim 1, wherein said die is made of a material wetting with respect to the melt.

* * * * *